US006799864B2

United States Patent
Bohler et al.

(10) Patent No.: US 6,799,864 B2
(45) Date of Patent: Oct. 5, 2004

(54) HIGH POWER LED POWER PACK FOR SPOT MODULE ILLUMINATION

(75) Inventors: Christopher L. Bohler, North Royalton, OH (US); Anthony D. Pollard, Hartford (GB); Greg E. Burkholder, Valley View, OH (US); James T. Petroski, Parma, OH (US); Mathew L. Sommers, Sagamore Hills, OH (US); Robert F. Karlicek, Jr., Santa Maria, CA (US); Stanton E. Weaver, Jr., Northville, NY (US); Charles A. Becker, Niskayuna, NY (US)

(73) Assignee: GELcore LLC, Valley View, OH (US)

( * ) Notice: Subject to any disclaimer, the term of this patent is extended or adjusted under 35 U.S.C. 154(b) by 0 days.

(21) Appl. No.: 10/063,924

(22) Filed: May 24, 2002

(65) Prior Publication Data

US 2002/0176250 A1 Nov. 28, 2002

Related U.S. Application Data

(60) Provisional application No. 60/293,827, filed on May 26, 2001.

(51) Int. Cl.[7] ............................................... F21V 29/00
(52) U.S. Cl. ...................... 362/236; 362/294; 362/373; 362/800; 362/231
(58) Field of Search ................................. 362/310, 545, 362/555, 294, 373, 345, 800, 231, 236, 240; 372/36, 43; 361/697; 313/45; 165/104.33

(56) References Cited

U.S. PATENT DOCUMENTS

| | | | | |
|---|---|---|---|---|
| 3,275,874 A | * | 9/1966 | Jannings ..................... 313/578 |
| 4,106,231 A | * | 8/1978 | MacNiel ....................... 40/547 |
| 4,729,076 A | * | 3/1988 | Masami et al. ............. 362/235 |
| 4,733,335 A | | 3/1988 | Serizawa et al. |
| 4,784,258 A | * | 11/1988 | Figari ......................... 206/5.1 |
| 4,875,057 A | * | 10/1989 | Hediger et al. ............. 347/242 |
| 5,029,335 A | * | 7/1991 | Fisher et al. .................. 372/36 |
| 5,036,248 A | * | 7/1991 | McEwan et al. ............ 313/500 |
| 5,168,537 A | * | 12/1992 | Rajasekharan et al. ........ 385/89 |
| 5,612,821 A | * | 3/1997 | Schmutz ..................... 359/622 |
| 5,852,339 A | * | 12/1998 | Hamilton et al. ............. 313/11 |
| 6,160,596 A | * | 12/2000 | Sylvester et al. ............. 349/61 |
| 6,161,910 A | * | 12/2000 | Reisenauer et al. ......... 315/309 |
| 6,211,626 B1 | | 4/2001 | Lys et al. |
| 6,254,262 B1 | | 7/2001 | Crunk et al. |
| 6,367,949 B1 | * | 4/2002 | Pederson ..................... 362/240 |
| 6,429,581 B1 | * | 8/2002 | Trentelman ................. 313/493 |
| 6,472,823 B2 | * | 10/2002 | Yen ............................. 315/112 |

FOREIGN PATENT DOCUMENTS

| | | |
|---|---|---|
| DE | 195 28 459 A1 | 2/1997 |
| DE | 20004105 U1 * | 5/2000 |
| EP | 0 202 335 A | 11/1986 |
| JP | 05218510 | 8/1993 |

* cited by examiner

Primary Examiner—Thomas M. Sember
Assistant Examiner—Hargobind Singh Sawhney
(74) Attorney, Agent, or Firm—Fay, Sharpe, Fagan, Minnich & McKee, LLP

(57) ABSTRACT

A light module includes a light emitting diode assembly defining a front side light emitting diode array and a rear side. The rear side is in thermal communication with a thermally conductive spreader, and a thermally conductive core is in thermal communication with the conductive spreader. The thermally conductive core includes an electrical conductor in operative communication with the front side light emitting diode array, and a plurality of appendages disposed about the thermally conductive core such that they are in thermal communication with the conductive spreader.

19 Claims, 3 Drawing Sheets

HIGH POWER LED POWER PACK FOR SPOT MODULE ILLUMINATION

This application claims priority of U.S. Provisional Application No. 60/293,827 filed on May 26, 2001.

BACKGROUND OF INVENTION

The present invention relates generally to light emitting diode (LED) technology for lighting applications. It finds particular application in conjunction with spot module illumination applications and will be described with particular reference thereto. It will be appreciated, however, that the invention is also amenable to other like applications.

Current spot module lamp technology relies primarily on halogen-type lamps for miniature reflector (MR) and parabolic reflector (PAR) type lamp illumination. The use of halogen-type lamps for spot lighting, however, has some drawbacks. For example, excessive heating can limit the usage of these types of lamps for commercial and consumer applications. Existing LED solutions have utilized standard, off-the-shelf, epoxy encapsulated, through hole LED sources in the light source array. Such configurations severely limit the output intensity of the lamp. Therefore, the potential market penetration that may be realized. by LED technology is correspondingly limited.

Until now efforts in this technology area have been primarily focused on multi-color digital control of output light in order to provide "color wash" capabilities in various styles of packages. LED-based lamps have been designed to mimic the MR lamp footprint. However, because the LEDs used to construct these lamps are not thermally conductive, the thermal resistivity of such lamps being about 300° C./W, these LED lamps produce excessive heat. Therefore, thermal loading is a critical issue for conventional LED-based MR lamps.

One attempt at addressing the thermal issue has been to package surface mount devices onto a metal clad printed circuit board (PCB). However, this is merely a planar approach where the PCB is not directly integrated into a heat sink fixture included in the body of the lamp. Therefore, it has not been possible to incorporate high powered LED lamps into MR packages.

The present invention provides a new and improved apparatus and method which overcomes the above-referenced problems and others.

SUMMARY OF INVENTION

In accordance with one aspect of the present invention, a light module is provided. It includes a light emitting diode assembly defining a front side light emitting diode array and a rear side. The rear side is in thermal communication with a thermally conductive spreader, and a thermally conductive core is in thermal communication with the conductive spreader. The thermally conductive core includes an electrical conductor in operative communication with the front side light emitting diode array, and a plurality of appendages are disposed about the thermally conductive core such that they are in thermal communication with the conductive spreader.

In accordance with another aspect of the present invention, a light emitting diode assembly includes a light emitting face supported by a body through which electrical connection elements pass. The body includes a thermally conductive core in thermal communication with the light emitting face. The thermally conductive core includes the electrical connection elements in electrical communication with light emitting diodes in the light emitting face. A plurality of thermally conductive attachments surround the thermally conductive core, and they are in thermal communication with the light emitting diode assembly.

In accordance with yet another aspect of the present invention, a lamp is provided for use in connection with spot module platforms. The lamp includes a plurality of LEDs arranged in an LED assembly having opposing forward and rearward facing sides. The forward facing side selectively provides illumination from the LEDs when power is supplied thereto. A heat sink is in thermal communication with the rearward facing side of the LED assembly, and it is arranged to draw heat from the LEDs. Heat dissipating means is in thermal communication with the heat sink, and it dissipates heat from the heat sink via convection.

One advantage of the present invention is that it will reduce the thermal resistivity of LED-based spot modules in MR or PAR-type lamps or other novel lamp configurations.

Another advantage of the present invention is that it makes possible the use of high powered LEDs within spot modules in MR or PAR-type lamps or other novel lamp configurations. The number of LEDs in the array may vary as desired for particular applications.

Another advantage of the present invention is that it produces an LED-based lamp that substantially mimics the footprint of conventional MR lamps. The same approach can also be used in the case of PAR-type lamps.

Another advantage of the present invention is that it produces brightness levels that surpass conventional clip-on filtered MR lamps.

Another advantage of the present invention is that either primary or a combination of primary and secondary lens configurations may be used to focus the light output to provide angular output from the spot module ranging from 10° to 65° full-width-half-maximum.

Another advantage of the present invention is that the operating temperature of the LED is reduced, thus increasing the operating lifetime of the LED based lamp.

Still further advantages of the present invention will become apparent to those of ordinary skill in the art upon reading and understanding the following detailed description of the preferred embodiments.

BRIEF DESCRIPTION OF DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION

Figure 1:
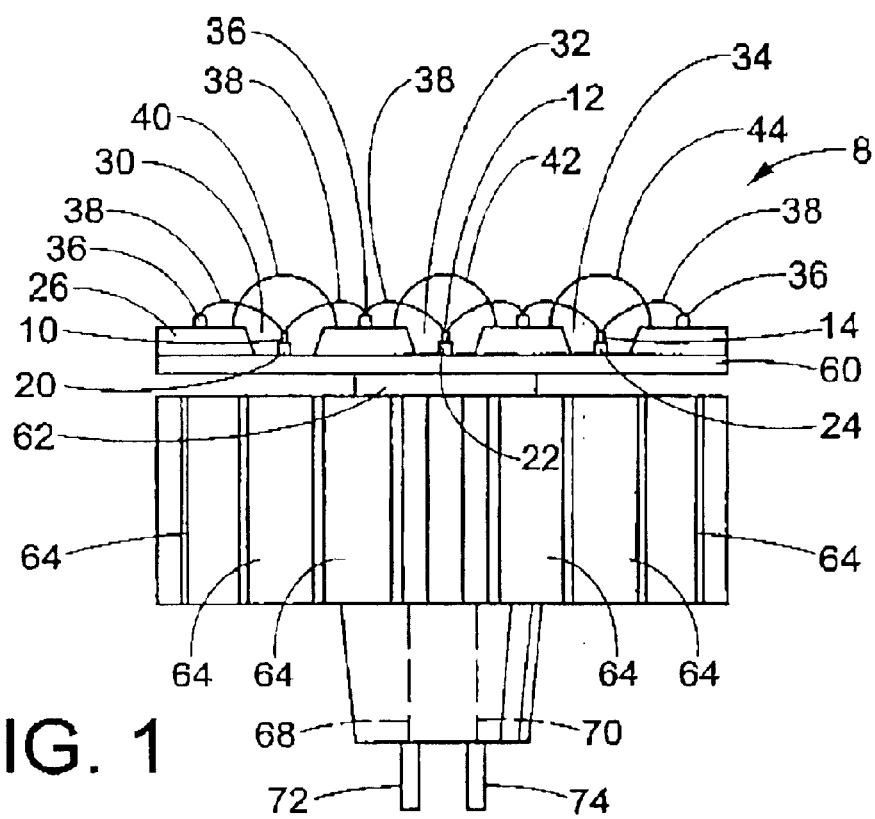
FIG. 1 illustrates a first embodiment of a device suitable to practice the present invention.

With reference to FIG. 7, a device 8 includes an integrated array of high power LEDs 10, 12, 14 mounted to respective electrically insulative submounts 20, 22, 24. The submounts 20, 22, 24 are secured to a metallic, rear side substrate 26 within respective wells 30, 32, 34. Optionally, the LEDs 10, 12, 14 are directly secured to the metallic substrate 26, thereby eliminating the use of submounts. The wells 30, 32, 34 in which the LEDs 10, 12, 14 reside are typically stamped or drilled directly into the substrate material to preferably form "reflector" shapes. However, other LED and well configurations are also contemplated. The submounts 20, 22, 24 (or optionally the LEDs 10, 12, 14) are secured to the rear side substrate 26, which acts as a heatsink, via a highly thermally conductive material (e.g., solder, filled epoxies, heat tape and/or other thermally advantageous adhesives). The LEDs 10, 12, 14 are connected to electrical contacts 36 via conductors 38.

Lenses 40, 42, 44 cover the respective LEDs 10, 12, 14. Optionally, a cap including a secondary optical lensing array is secured over the LEDs in the wells. In this case, the respective lenslets within the lensing array are mapped in a one-to-one relationship to the LEDs and the wells.

The substrate 26 is secured to a heat spreader 60, which includes a thermally conductive material such as metal. During use, heat generated by the LEDs 10, 12, 14 is passed to the substrate 26 and then transferred to the heat spreader 60. The heat is distributed relatively evenly across the spreader 60. The spreader 60 is secured to a thermally conductive core 62. Thermally conductive fins 64 surround and extend from the core 62. In the illustrated embodiment, the fins 64 form an independent assembly that is interference fit with the core 62. In one embodiment, a tight interference fit is ensured by shrinking the core 62 and expanding the fins 64 prior to assembly. More specifically, the core's outer diameter is temporarily shrunk by cooling (e.g., freezing) the core 62 and the inner diameter of the heatsink fins 64 is temporarily expanded by heating the fins 64. Then, the fin assembly is slid or otherwise positioned around the core 62. Once the parts return to an ambient temperature, a tight interference fit is created between the fin assembly and the core 62. Because the fins 64 contact the core 62, heat is conducted from the core to the external environment via the fins 64. Alternately, the heat spreader 60 and finned heat sink 64 may be cast as a single piece of thermally conductive material. Electrical conductors 68, 70 pass through the core 62 and the heat spreader 60 to supply power received by pins 72, 74 to the LEDs 10, 12, 14. Finned heat sink shapes other than the one shown are contemplated in order to increase the outer surface area for improved thermal management, as well as providing a more aesthetically pleasing look to the "lamp".

It is understood to those skilled in the art that the number of LEDs in the array may vary according to the lamp output desired.

FIGS. 2–5 illustrates alternate embodiments of the present invention. Components in these embodiments that correspond to the respective components of the embodiment illustrated in FIG. 1 are given the same numerical references followed by a primed (') symbol. New components are designated by new numerals.

Figure 2:
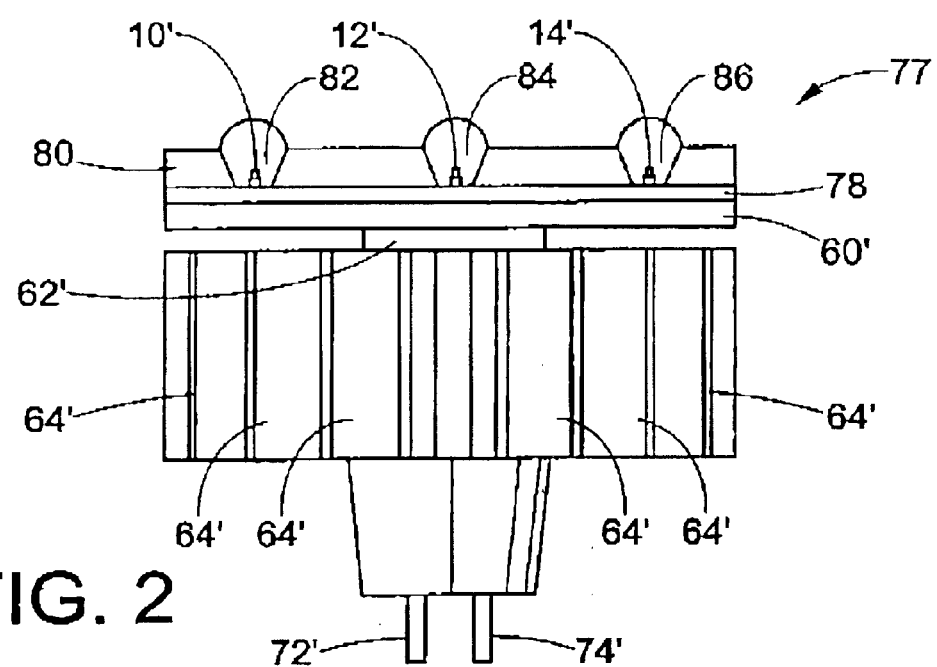
FIG. 2 illustrates a second embodiment of a device suitable to practice the present invention.

With reference to FIG. 2, a device 77 includes a substantially flat substrate 78, onto which the high power LEDs 10', 12', 14' are mounted. A cover 80 is secured over the substrate 78. The cover includes recesses 82, 84, 86 that map in a one-to-one relationship to the LEDs 10', 12', 14'. The recesses 82, 84, 86 are shaped for forming respective reflectors (e.g., honeycomb shaped) that may be conic, parabolic or an alternately contoured shape to provide the desired light output beam pattern.

Figure 3:
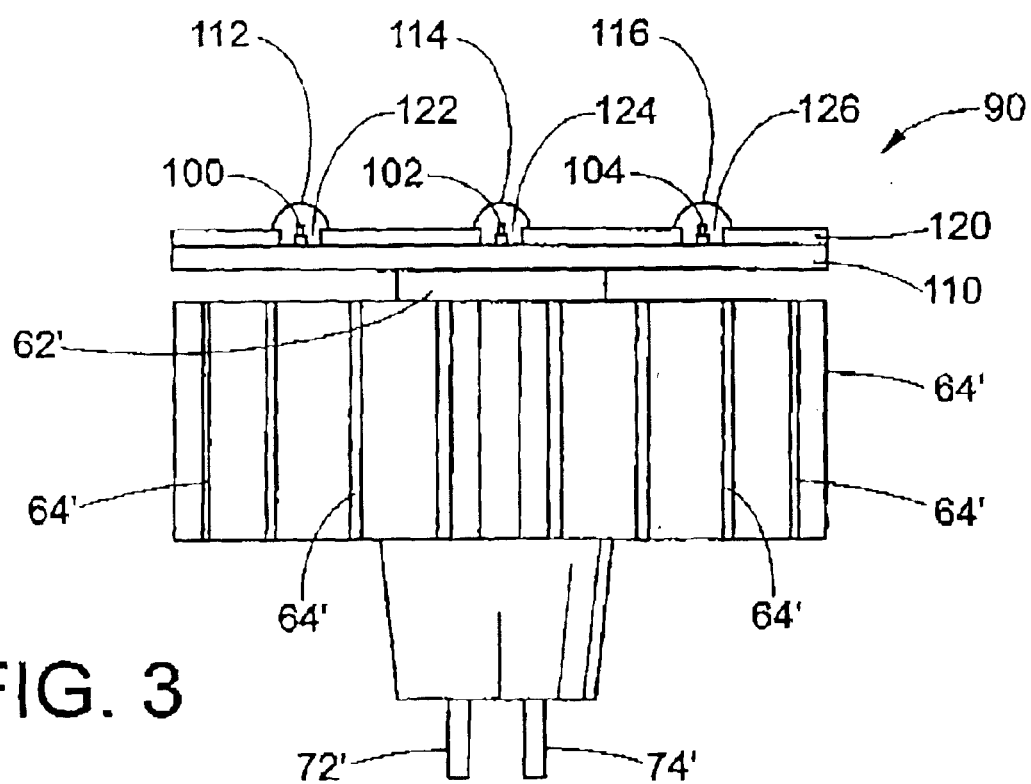
FIG. 3 illustrates a third embodiment of a device suitable to practice the present invention.

With reference to FIG. 3, another embodiment of the present invention includes a device 90 having a plurality of high power LEDs 100, 102, 104 mounted on a metallic slug (e.g., a heat spreader) 110. Optionally, each of the LEDs is mounted to the slug 110 via an electrically insulated submount. In this embodiment, each of the LEDs 100, 102, 104 is individually packaged as a discrete unit. Furthermore, each of the packages includes a single primary optic (e.g., a lens) 112, 114, 116. The packages are electrically connected utilizing a circuit board 120. The circuit board 120 is designed for optimum thermal dissipation from the discrete package, such as with a metal core printed circuit board. Optionally, the board incorporates through holes 122, 124, 126 to allow direct connection of a heatsink included in the package to the slug 110, which acts as a heatsink for the assembly. The LEDs 100, 102, 104 are secured to the slug 110 via a thermally conductive adhesive or solder (e.g., heat tape). Alternatively, the thermally conductive adhesive or solder secures the LEDs 100, 102, 104 to the respective submounts and, furthermore, secures the submounts to the slug 110. A circuit (not shown) on the board 120 electrically connects the LEDs 100, 102, 104 to a power source. The circuit is preferably formed from standard metallic and ceramic materials; however, other materials are also contemplated.

Figure 4:
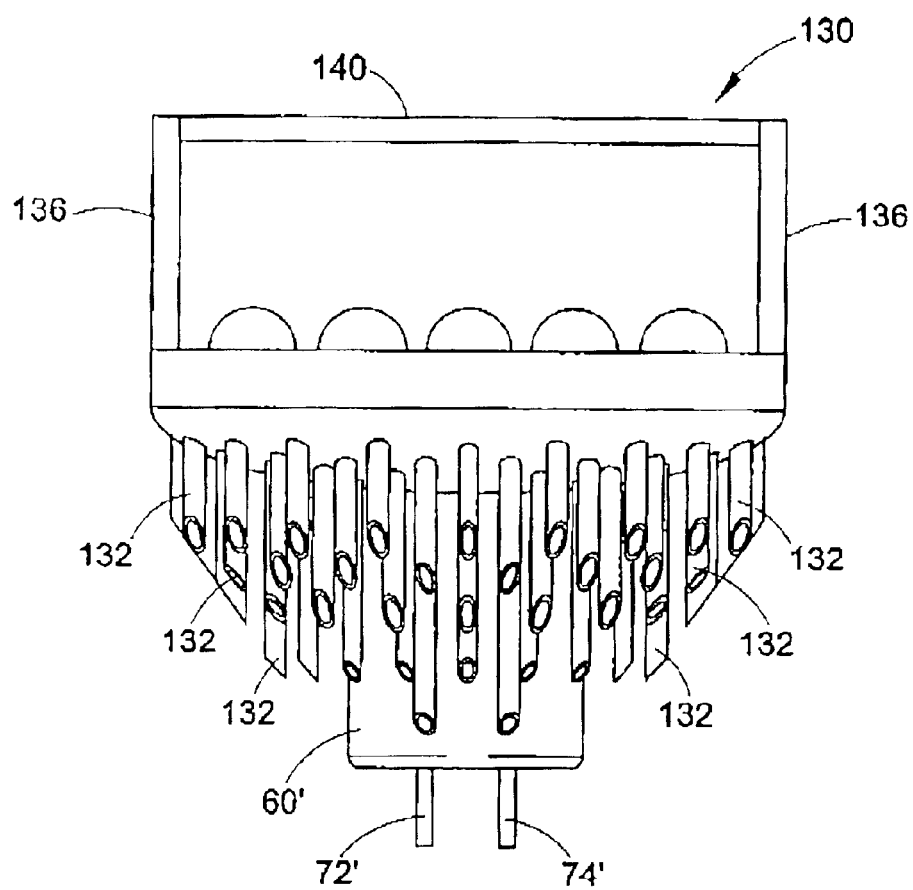
FIG. 4 illustrates a fourth embodiment of a device suitable to practice the present invention.

With reference now to FIG. 4, an alternate embodiment of an LED module 130 includes a plurality of thermally conductive pillars or shaped protrusions 132 extending from a back side of the LED array as opposed to extending from the thermally conductive core as described above. It is now apparent to those skilled in the art that the location of the heat dissipating extensions or protrusions on the lighting module is variable and that other equally functional placements are possible. Moreover, extension or protrusion shape, physical continuity and material may also be varied for specific applications.

FIG. 4 also illustrates a housing 136, made from plastic, metal or other material, attached around a periphery of the light emitting face. Opposite the LEDs, an optic 140 is attached to the housing 136, preferably, by threads, snapping, clipping, screwing or the like. The optic 140 may be tinted as desired, or color matched to the underlying LEDs to provide a desired output color, or may be clear, and can be formed as a flat window, a lens or other optical adjusting system or beam shaper, a multiple fresnel optic system, a diffuser, or otherwise. Optionally, the optic 140 may comprise a lenticular plate or an array of lenslets having optical axes that align with the underlying LEDs. In any event, preferably, the optic 140 attaches to the housing 136 so that an assortment of different types thereof are readily interchangeable as desired to selectively tailor the module 130 for various applications. Additionally, the housing 136 is optionally height adjustable and/or interchangeable with an assortment of different height housings to select a desired distance between the optic 140 and the underlying LEDs. Artisans will appreciate that by having a variable separation between the LEDs and the optic 140 in this manner, lens of different focal lengths can be accommodated.

Figure 5:
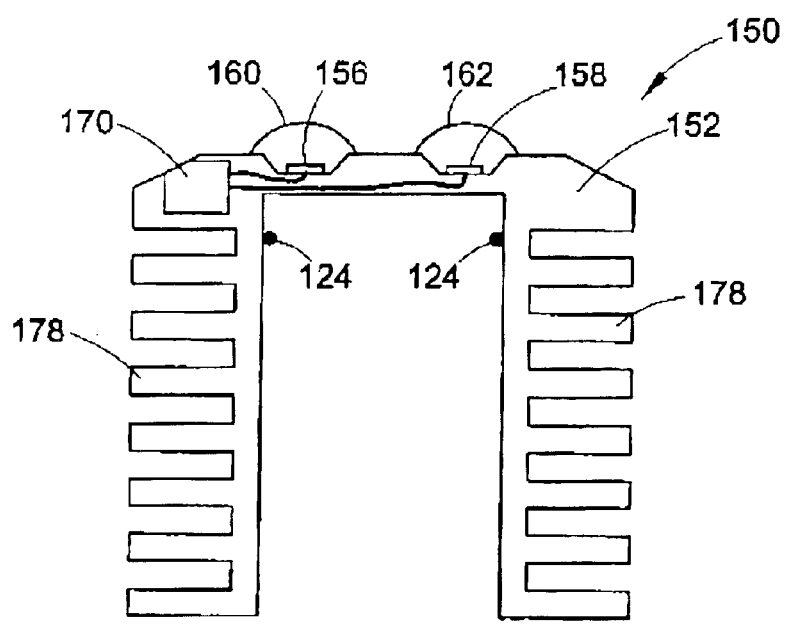
FIG. 5 illustrates another embodiment of a device suitable to practice the present invention.

With reference to FIG. 5, an alternate fixture 150 includes a metallic substrate 152 or heat-dissipating fixture that doubles as a housing of a lamp assembly. Included are high power LEDs 156, 158 with corresponding lenses 160, 162. Such a body 152 is preferably produced from aluminum or other thermally conductive materials in a suitably cast or machined shape. A circuit 170 for interconnecting the LEDs to a power source (not illustrated) may be directly patterned on the housing assembly or consist of a printed wiring board affixed to the top surface of the housing. The circuit includes openings for the LEDs 156, 158 and optionally includes mechanical features for attaching the lenses 160, 162. Electrical connection to the circuit 170 is made through contacts 174 in the central portion, which may be adapted to receive a power supply or leads from an off-device power supply. Alternately, electrical connection may be made through vias or holes in the housing. The hollow central portion of the housing additionally may be used to contain other electrical control circuitry for the LEDs 156, 158 and the bottom of the housing may be attached to a suitable connector design for connection to a socket. Heat dissipating fins 178 surround the exterior of the assembly. It is understood to those skilled in the art that the number and color of LEDs in the array in a single housing may vary according to the lamp output desired. Moreover, the number and arrangement of attached heat dissipating fins is variable as desired.

The mechanical designs disclosed in the devices of the present invention have thermal resistivities on the order of about 40° C./W or less (e.g., about 15° C./W). Furthermore, it is to be understood that the devices 8, 77, 90, 130, 150 may be designed to mimic the footprint of conventional lamps of the MR or PAR-type (e.g., MR-16 lamps).

Preferably, the high power LEDs used in the present invention produce saturated colors (e.g., green, blue, cyan, red, orange, yellow, or amber) and/or white light such that the respective lamps produce at least about 60 lumens of light. Multiple colors within an array are also envisioned.

Preferably, the lenses and lenslets of the present invention are of the refractive, diffractive or Fresnel lens variety and are designed to produce spot light beams ranging from about a 10° to about a 65° spread for use in spot light applications.

It is also contemplated that power conversion components be included within the devices 8, 77, 90, 130, 150 for converting alternating current (AC) inputs (e.g., 12 VAC, 120 VAC, or 220 VAC) to the direct current, low voltage power used to power the LEDs. Power conversion components for universal AC inputs are also contemplated.

It is also contemplated that the individual LEDs within the devices 8, 77, 90, 130, 150 be selectively operated. In this case, individual or group LED addressing can be accomplished either locally with suitable control circuitry located in the lamp assembly, or through communication means for selectively addressing the individual LEDs remotely.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A light module, comprising:
    a light emitting diode assembly including a generally planar front side light emitting diode array and a rear side, the rear side in thermal communication with a thermally conductive spreader;
    a thermally conductive elongated core having a first end in thermal communication with the conductive spreader, the thermally conductive core being elongated in a direction transverse to the generally planar front side light emitting dode array to define a second end distal from the conductive spreader; and
    a plurality of appendages, disposed around the thermally conductive core, the plurality of appendages in thermal communication with the conductive spreader, and extending away from the thermally conductive core.

2. The light module as set forth in claim 1, further comprising:
    a housing surrounding the front side light emitting diode array; and
    an optic removably affixed to the housing opposite the front side light emittting diode array.

3. The light module as set forth in claim 1, wherein the plurality of appendages comprises fins surroundingly attached to the thermally conductive core, said fins not contacting the thermally conductive spreader, said fins thermally conductively communicating with the thermally conductive spreader through the thermally conductive elongated core.

4. The light module as set forth in claim 1, wherein the light emitting diode assembly comprises a number of light emitting diodes, each light emitting diode disposed in a shaped recess, the recess and light emitting diode covered with a lens.

5. The light module as set forth in claim 1, wherein the light emitting diode assembly comprises individually packaged light emitting diode elements.

6. The light module as set forth in claim 5, wherein the individually packaged light emitting diode elements are secured in thermal communication to the thermally conductive spreader.

7. The light module as set forth in claim 1, wherein the light module has a thermal resistivity of less than 40 degrees Centigrade per watt.

8. The light module as set forth in claim 1, wherein the thermally conductive core has an electrical conduit passing from the first end to the second end to provide electrical access to the front side light emitting diode array from the second end of the thermally conductive elongated core, and a physical size and shape of an exterior of the thermally conductive elongated core and the electrical conductor are designed to be accommodated in a fixture selected from a group consisting of MR-style fixtures and PAR-style fixtures.

9. The light module as set forth in claim 1, wherein the front side light emitting diode array selectively produces saturated color light, the saturated color light being produced by the light emitting diodes emitting a narrow band light.

10. The light module as set forth in claim 1, wherein the front side light emitting diode array selectively produces white light.

11. The light module as set forth in claim 1, wherein the front side light emitting diode array selectively produces desaturated colors based on a mixture from a variety of saturated color LEDs.

12. The light module as set forth in claim 1, wherein the front side light emitting diode array selectively produces at least 50 lumens of light.

13. The light module as set forth in claim 1, further comprising individually powerable sets of diodes in the front side light emitting diode array.

14. A light emitting diode assembly including a light emitting face supported by a body through which electrical connection elements pass, the body comprising:
    a thermally conductive elongated core in thermal communication with the light emitting face, the thermally conductive core providing a path for the electrical connection elements to be in electrical communication with light emitting diodes in the light emitting face; and
    a plurality of thermally conductive elongated attachments surrounding the thermally conductive core, the plurality of attachments being in thermal communication with the light emitting diode assembly.

15. A lamp for use in connection with spot module platforms, said lamp comprising:
- a plurality of LEDs arranged in an LED assembly having opposing forward and rearward facing sides, said forward facing side selectively providing illumination from the LEDs when power is supplied thereto;
- a heat sink contacting the rearward facing side of the LED assembly to draw heat from the LEDs, the heat sink including:
  - (i) a thermally conductive base having a lateral area substantially coextensive with the rearward facing side of the LED assembly and in thermal contact with the rearward facing side of the LED assembly, and
  - (ii) an elongated thermally conductive core having a lateral area less than the lateral area of the rearward facing side and connecting with a central area of the thermally conductive base, the elongated thermally conductive core extending from the thermally conductive base in a direction away from the LED assembly; and,
- a heat dissipating structure including a plurality of heat-dissipating members each extending away from a connection of the heat-dissipating member with the heat sink, the heat dissipating structure connected with the elongated thermally conductive core.

16. The lamp according to claim 15, wherein the LEDs are disposed in reflector wells.

17. The lamp according to claim 15, wherein the saturated color light is produced by the LEDs emitting a narrow wavelength light.

18. The lamp according to claim 17, wherein the desaturated color is produced by mixing the LEDs producing a variety of saturated colors.

19. The lamp according to claim 15, wherein the heat dissipating structure is not connected with the thermally conductive base of the heat sink.

* * * * *

UNITED STATES PATENT AND TRADEMARK OFFICE
CERTIFICATE OF CORRECTION

PATENT NO. : 6,799,864 B2
APPLICATION NO. : 10/063924
DATED : October 5, 2004
INVENTOR(S) : Christopher L. Bohler et al.

It is certified that error appears in the above-identified patent and that said Letters Patent is hereby corrected as shown below:

Col. 5, Line 62
Claim 1, Line 62, change "dode" to --diode--.

Col. 5, Line 64
Claim 1, Line 64, change "disposed around" to --surrounding--.

Col. 6, Line 66
Claim 2, Line 66, "FIG 7" should be --FIG 1--.

Signed and Sealed this

Thirteenth Day of February, 2007

JON W. DUDAS
*Director of the United States Patent and Trademark Office*